United States Patent
Hsu et al.

(10) Patent No.: US 7,530,043 B2
(45) Date of Patent: May 5, 2009

(54) PRINTED CIRCUIT BOARD ABLE TO SUPPRESS SIMULTANEOUS SWITCHING NOISE

(75) Inventors: Shou-Kuo Hsu, Taipei Hsien (TW); Cheng-Hong Liu, Taipei Hsien (TW)

(73) Assignee: Hon Hai Precision Industry Co., Ltd., Tu-Cheng, Taipei-Hsien (TW)

( * ) Notice: Subject to any disclaimer, the term of this patent is extended or adjusted under 35 U.S.C. 154(b) by 108 days.

(21) Appl. No.: 11/563,158

(22) Filed: Nov. 25, 2006

(65) Prior Publication Data

US 2008/0002337 A1    Jan. 3, 2008

(30) Foreign Application Priority Data

Jun. 30, 2006    (CN) .................... 2006 1 0061422

(51) Int. Cl.
*G06F 17/50* (2006.01)
*H05K 7/08* (2006.01)
*H05K 1/11* (2006.01)

(52) U.S. Cl. .................. 716/15; 361/780; 361/790; 361/792; 361/794

(58) Field of Classification Search ......... 361/748–804; 174/250
See application file for complete search history.

(56) References Cited

U.S. PATENT DOCUMENTS

| 4,942,400 | A | 7/1990 | Tarzaiski et al. |
| 6,441,313 | B1 * | 8/2002 | Novak .......................... 174/255 |
| 6,564,355 | B1 | 5/2003 | Smith et al. |
| 2007/0258173 | A1 * | 11/2007 | Chen et al. .................... 361/42 |

FOREIGN PATENT DOCUMENTS

JP            03014284   A   *   1/1991

* cited by examiner

*Primary Examiner*—Vuthe Siek
*Assistant Examiner*—Aric Lin
(74) *Attorney, Agent, or Firm*—Wei Te Chung

(57) ABSTRACT

A printed circuit board includes a first layer including a first power portion and a first ground portion isolated from each other, and a second layer including a second power portion and a second ground portion isolated from each other. The second layer is spaced from the first layer. The second ground portion is arranged below the first power portion. The second power portion is arranged below the first ground portion. One portion of the first power portion overlaps one portion of the second power portion, and one portion of the first ground portion overlaps one portion of the second ground portion to provide a zero-intensity electric field between the first layer and the second layer. The first power portion is coupled to the second power portion via a first via. The first ground portion is coupled to the second ground portion via a second via.

15 Claims, 5 Drawing Sheets

PRINTED CIRCUIT BOARD ABLE TO SUPPRESS SIMULTANEOUS SWITCHING NOISE

BACKGROUND OF THE INVENTION

1. Field of the Invention

The present invention relates to printed circuit boards, and particularly to suppression of simultaneous switching noise in a printed circuit board.

2. Description of Related Art

Multi-layer printed circuit boards are broadly used in electronic devices. A conventional four-layer printed circuit board (PCB) as shown in FIG. 1 includes two signal layers 1, 2, a power plane 3, and a ground plane 4. The power plane 3 and the ground plane 4 are disposed between the signal layer 1 and the signal layer 2.

As the density of integrated circuits on PCB's increase, the problems associated with signal switching noise become greater. Many integrated circuits have a large number of input/output (I/O) drivers. Several hundred drivers may be present in some integrated circuits, and this number will undoubtedly become greater as packaging density increases in the future. Noise that occurs in the PCB when a large number of drivers simultaneously switch from one state to another is known as simultaneous switching noise (SSN). The problem may be even more acute when the drivers all switch in the same direction (e.g. high to low). When a large number of drivers switch simultaneously, various signal integrity problems may occur. For example, SSN from a given chip on the signal layer 1 is transmitted to power plane 3 and the ground plane 4 via transmission lines of a power supply and a ground of the given chip. Then the SSN diffuses in the power plane 3 and the ground plane 4. Receivers of other chips on the signal layer 1 may receive the SSN and take incorrect actions.

What is needed, therefore, is a PCB with reduced SSN therein.

SUMMARY OF THE INVENTION

A printed circuit board is provided. In a preferred embodiment, the printed circuit board includes a first layer including a first power portion and a first ground portion isolated from each other, and a second layer including a second power portion and a second ground portion isolated from each other. The second layer is spaced from the first layer. The second ground portion is arranged below the first power portion. The second power portion is arranged below the first ground portion. Each of the ground portions and the power portions includes an extending portion and a cutout. The extending portion of the first power portion complementarily extends into the cutout of the first ground portion. The extending portion of the first ground portion complementarily extends into the cutout of the first power portion. The extending portion of the second power portion complementarily extends into the cutout of the second ground portion. The extending portion of the second ground portion complementarily extends into the cutout of the second power portion. The extending portion of the first power portion overlaps the extending portion of the second power portion. The extending portion of the first ground portion overlaps the extending portion of the second ground portion. The extending portion of the first power portion is coupled to the extending portion of the second power portion via a first via. The extending portion of the first ground portion is coupled to the extending portion of the second ground portion via a second via.

Other advantages and novel features will become more apparent from the following detailed description when taken in conjunction with the accompanying drawings, in which:

DETAILED DESCRIPTION OF THE INVENTION

Figure 2:
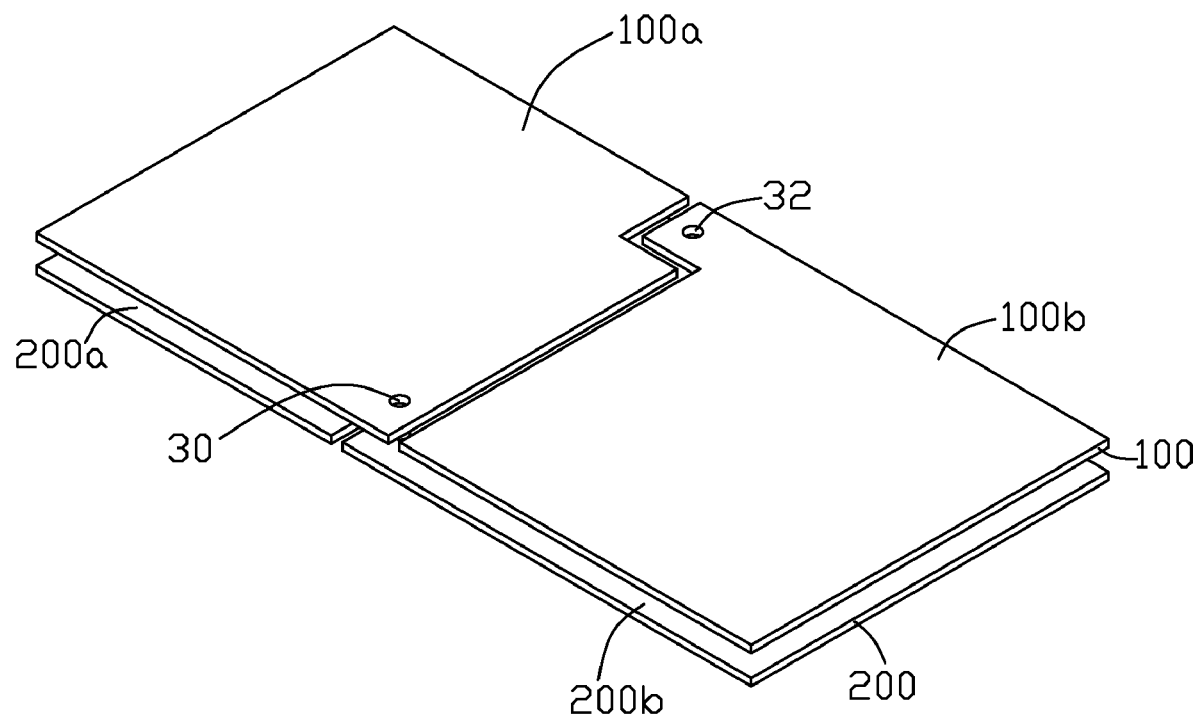
FIG. 2 is an isometric, schematic diagram of two layers of a printed circuit board in accordance with a preferred embodiment of the present invention.
Figure 3:
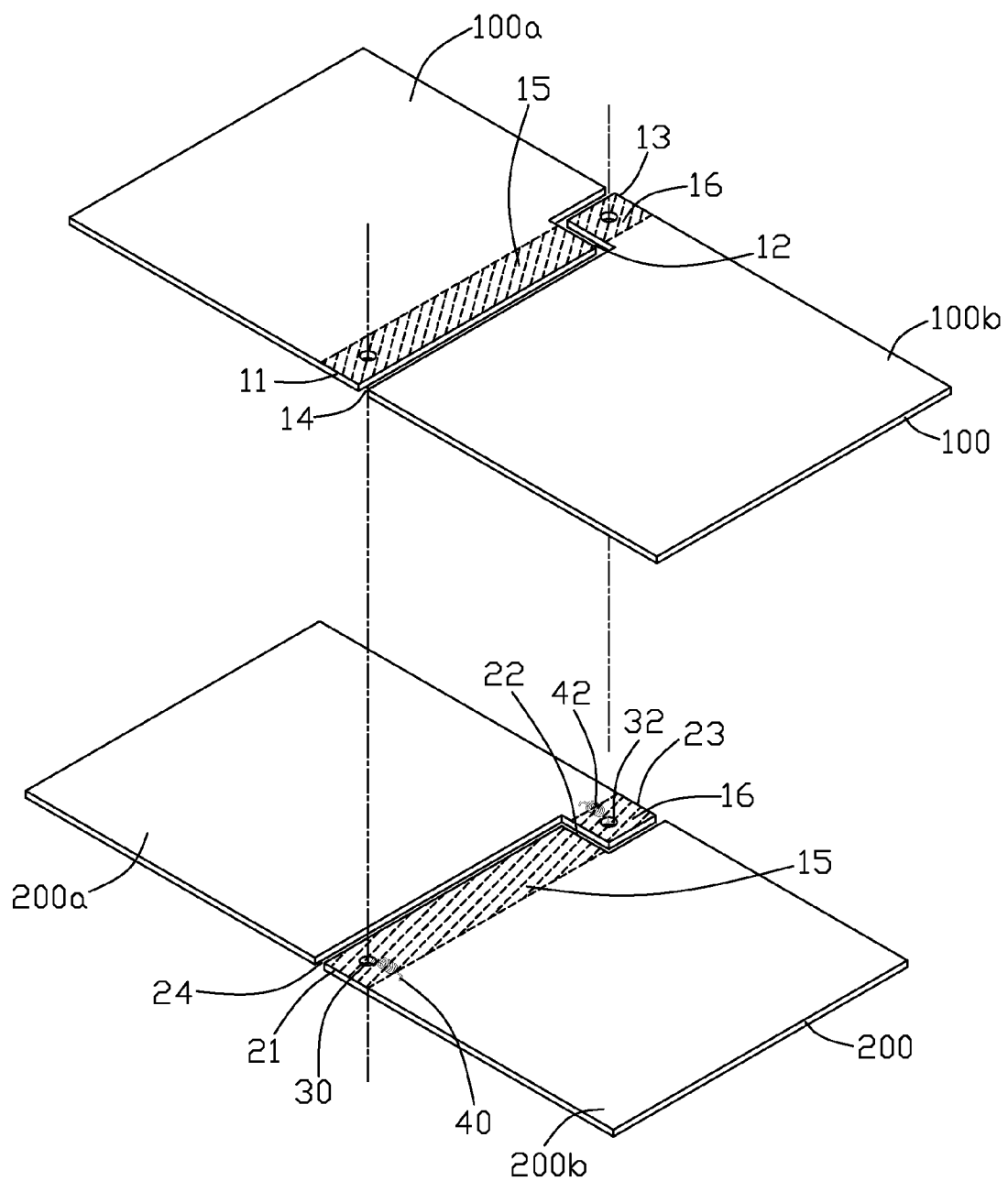
FIG. 3 is an exploded view of FIG. 2, together with a first ferrite bead and a second ferrite bead.

Referring to FIGS. 2 and 3, a printed circuit board (PCB) in accordance with a preferred embodiment of the present invention includes a first layer 100 and a second layer 200 spaced from each other. The first layer 100 includes a first power portion 100a and a first ground portion 100b isolated from each other with isolating material such as fiberglass located therebetween. The second layer 200 includes a second power portion 200b and a second ground portion 200a isolated from each other with isolating material such as fiberglass located therebetween. The second ground portion 200a is arranged below the first power portion 100a. The second power portion 200b is arranged below the first ground portion 100b.

The first power portion 100a has a stepped edge, thereby forming an extending portion 11 and a cutout 12. The first ground portion 100b has a stepped edge, thereby forming an extending portion 13 and a cutout 14. The second power portion 200b has a stepped edge, thereby forming an extending portion 21 and a cutout 22. The second ground portion 200a has a stepped edge, thereby forming an extending portion 23 and a cutout 24. The extending portion 11 complementarily extends into the cutout 14. The extending portion 13 complementarily extends into the cutout 12. The extending portion 21 complementarily extends into the cutout 24. The extending portion 23 complementarily extends into the cutout 22. The extending portion 11 is electrically coupled to the extending portion 21 via a first via 30. The extending portion 13 is electrically coupled to the extending portion 23 via a second via 32.

The extending portion 11 overlaps the extending portion 21, forming an overlap 15. The extending portion 13 overlaps the extending portion 23, forming an overlap 16. A voltage between the extending portion 11 and the extending portion 21 within the overlap 15 is zero. A voltage between the extending portion 13 and the extending portion 23 within the overlap 16 is zero. According to the laws of electromagnetism, when the voltage is zero, the electric field is zero. A zero-intensity electric field between the first layer 100 and the second layer 200 is therefore provided. The zero-intensity electric field can block the transmission of simultaneous switching noise (SSN) between the first power portion 100a and the second power portion 200b, and between the first ground portion 100b and the second ground portion 200a.

The PCB in accordance with the preferred embodiment of the present invention further includes a first ferrite bead 40 and a second ferrite bead 42. The first ferrite bead 40 has two terminals respectively connected to the first via 30 and the second power portion 200*b*. The second ferrite bead 42 has two terminals respectively connected to the second via 32 and the second ground portion 200*a*. The first ferrite bead 40 can block a particular frequency of SSN going from the first power portion 100*a* to the second power portion 200*b*. The second ferrite bead 42 can block another particular frequency of SSN going from the first ground portion 100*b* to the second ground portion 200*a*. A designer can acquire values of the undesired particular frequencies with the use of simulation software analysis of a PCB, and then ascertain parameters of the first ferrite bead 40 and the second ferrite bead 42 using the acquired values.

The area of the extending portion 11 of the first power portion 100*a* and the area of the extending portion 13 of first ground portion 100*b* are unequal to avoid a resonance effect. The area of the extending portion 21 of the second power portion 200*b* and the area of the extending portion 23 of the second ground portion 200*a* are also unequal to avoid a resonance effect. For example, in the embodiment as shown in FIG. 3, the area of the extending portion 11 is greater than the area of the extending portion 13, and the area of the extending portion 21 is greater than the area of the extending portion 14. The area of the extending portion 11 is preferably equal to that of the extending portion 21 and the area of the extending portion 13 is preferably equal to that of the extending portion 23.

Figure 1:
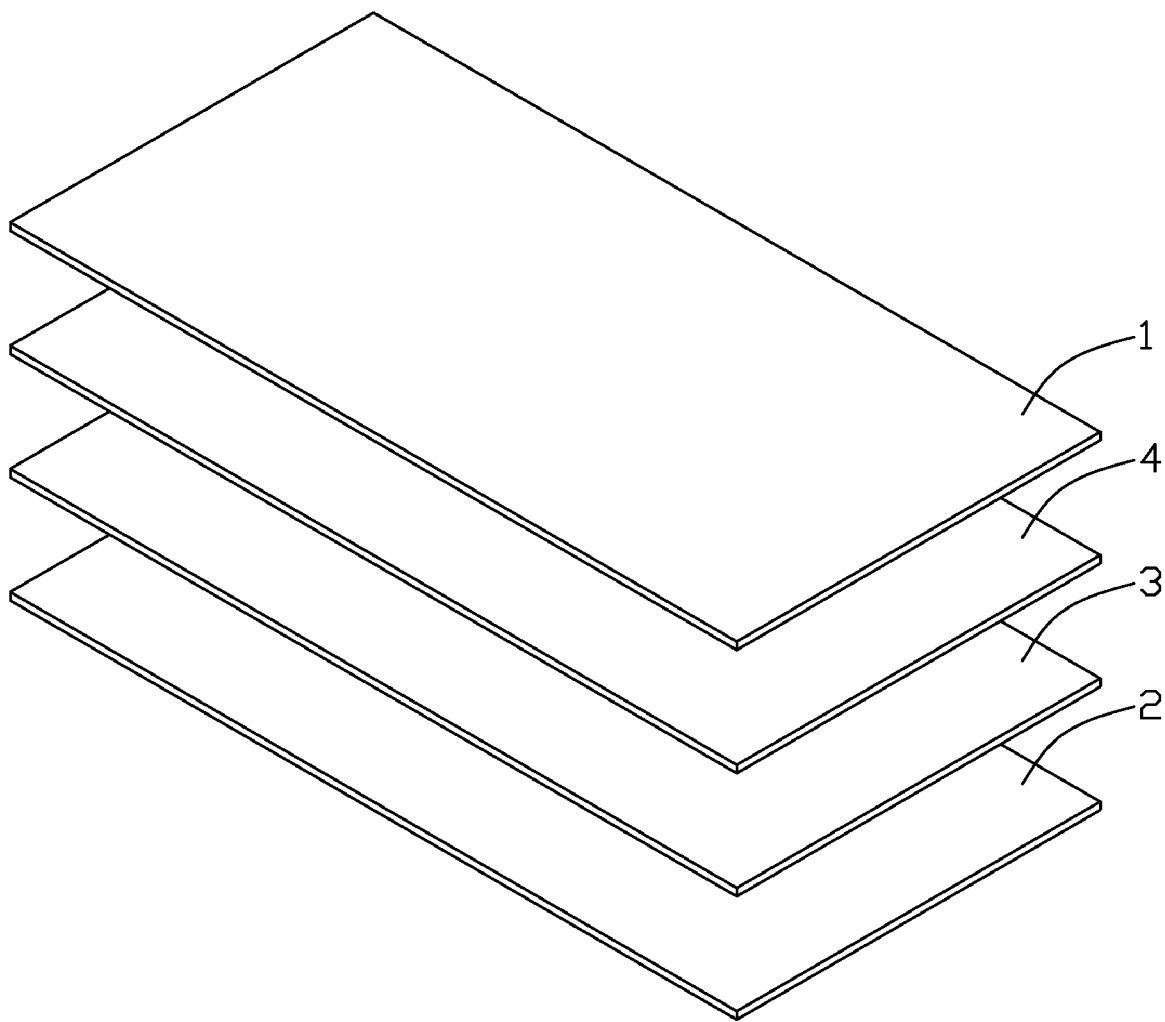
FIG. 1 is a schematic diagram of a conventional four-layer printed circuit board.
Figure 4:
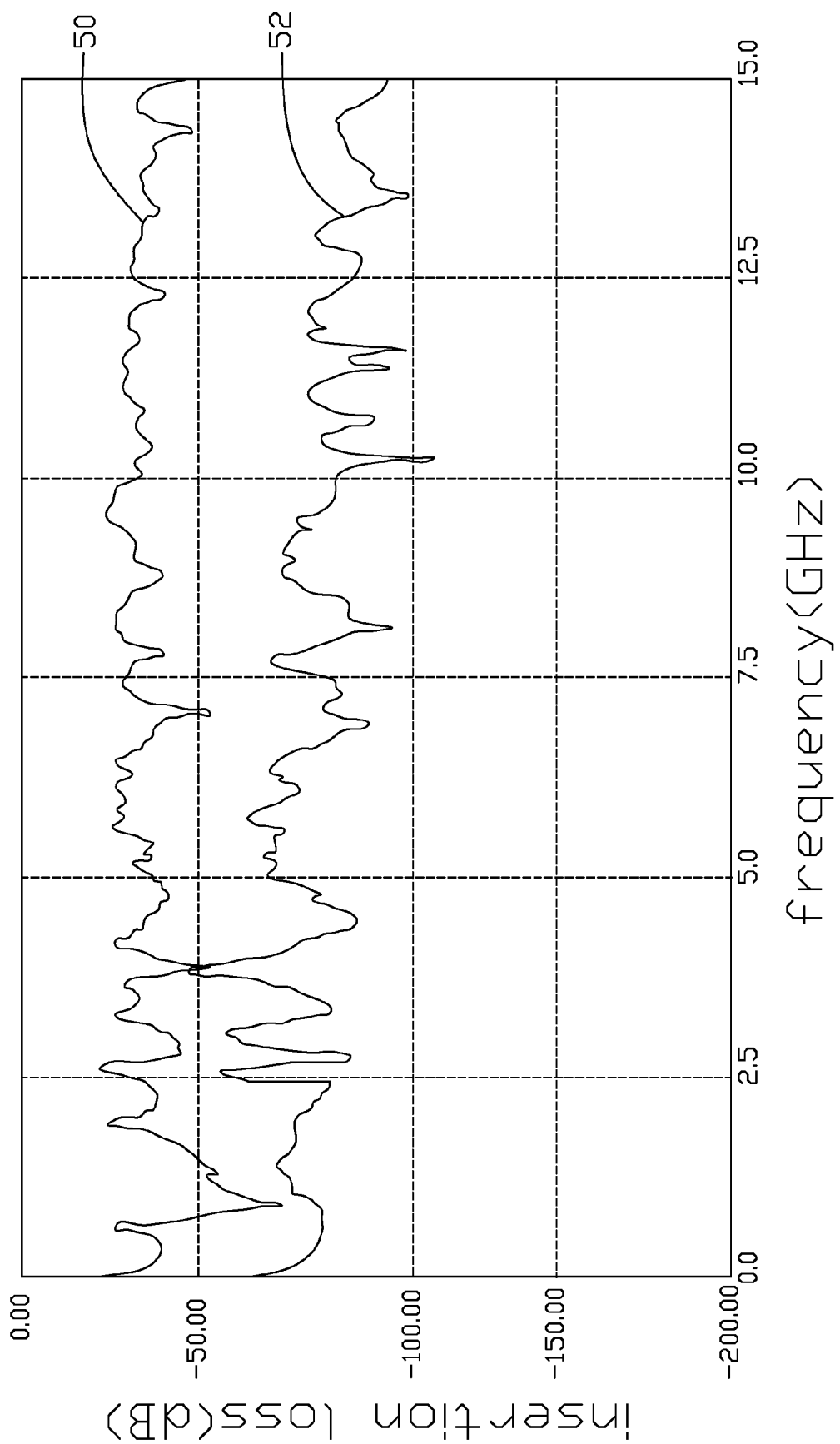
FIG. 4 is a graph of insertion loss versus frequency in the PCB of FIG. 1 and the PCB of FIG. 3.

FIG. 4 shows a graph comparing insertion loss versus frequency in the PCB of FIG. 1 and the PCB of FIG. 3. A curve 50 is an insertion loss versus frequency curve of the PCB of FIG. 1. A curve 52 is an insertion loss versus frequency curve of the PCB of FIG. 3. The curves 50, 52, show the insertion loss of the PCB of FIG. 3 is less than the insertion loss of the PCB of FIG. 1. Less insertion loss indicates a better effect of blocking SSN.

Figure 5:
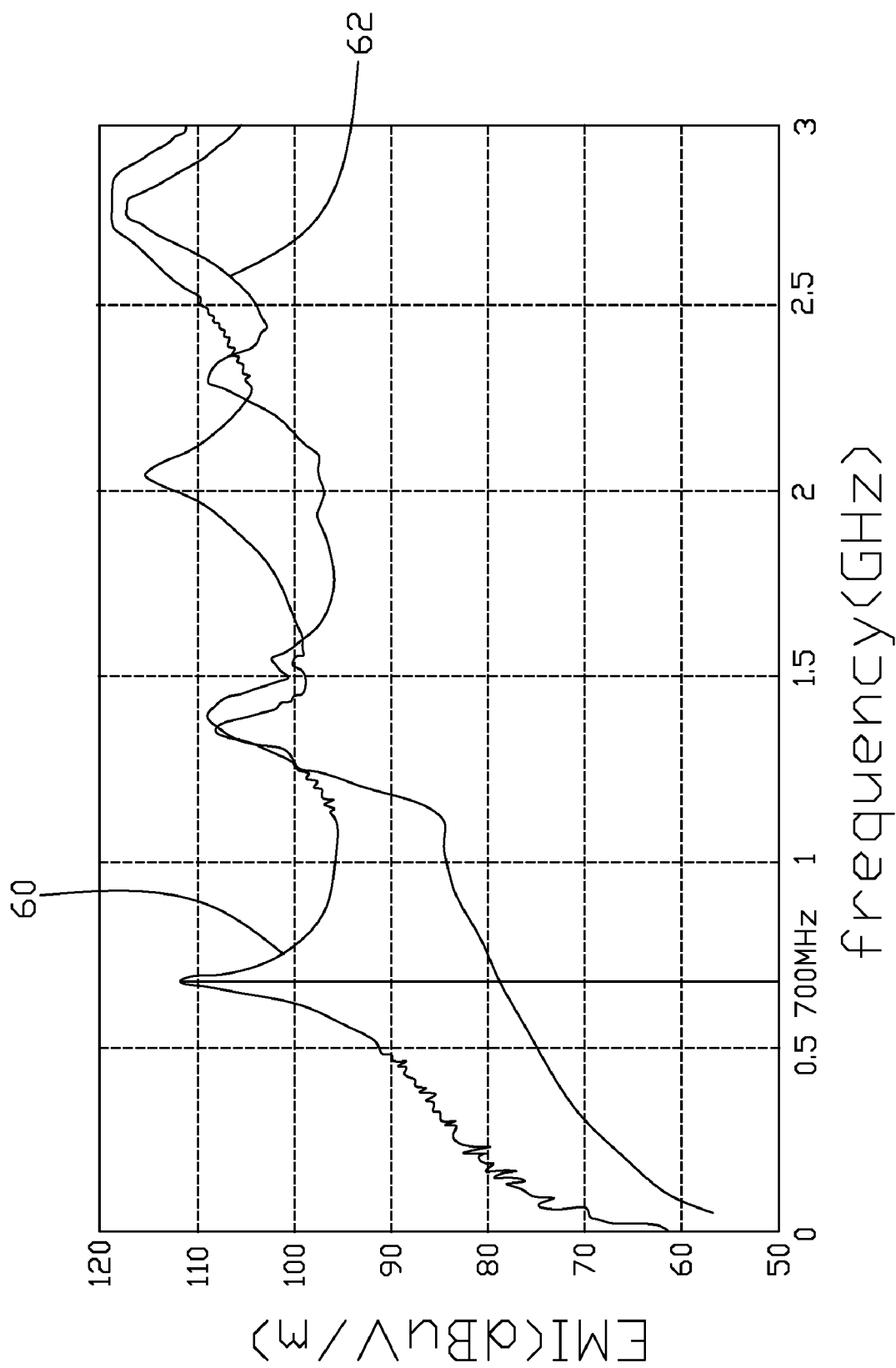
FIG. 5 is a graph of electromagnetic interference (EMI) versus frequency in the PCB of FIG. 1 and the PCB of FIG. 3.

According to known current specifications in the electronics field regarding EMI, an electronic device emitting excessive EMI within a 0~1 GHz frequency band is unqualified. FIG. 5 shows a graph comparing EMI versus frequency in the PCB of FIG. 1 and the PCB of FIG. 3. A curve 60 is an EMI versus frequency curve of the PCB of FIG. 1. A curve 62 is an EMI versus frequency curve of the PCB of FIG. 3. The curves 60, 62, show that EMI at the 700 MHz frequency of the PCB of FIG. 3 is greatly reduced.

The foregoing description of the exemplary embodiment of the invention has been presented only for the purposes of illustration and description and is not intended to be exhaustive or to limit the invention to the precise forms disclosed. Many modifications and variations are possible in light of the above teaching. The embodiment was chosen and described in order to explain the principles of the invention and its practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiment described therein.

What is claimed is:

1. A printed circuit board comprising:
   a first layer comprising a first power portion and a first ground portion in a same plane and isolated from each other; and
   a second layer spaced from the first layer, the second layer comprising a second power portion and a second ground portion in a same plane and isolated from each other, wherein
   the first layer overlaps the second layer with the second ground portion arranged below the first power portion, and the second power portion is arranged below the first ground portion, each of the ground portions and the power portions comprises an edge forming an extending section in the same plane with the corresponding ground or power portion and a cutout, the extending section of the first power portion extends into the cutout of the first ground portion, the extending section of the first ground portion extends into the cutout of the first power portion, the extending section of the second power portion extends into the cutout of the second ground portion, the extending section of the second ground portion extends into the cutout of the second power portion, the extending section of the first power portion overlaps the extending section of the second power portion, the extending section of the first ground portion overlaps the extending section of the second ground portion, the extending section of the first power portion is electrically coupled to the extending section of the second power portion via a first via, the extending section of the first ground portion is electrically coupled to the extending section of the second ground portion via a second via.

2. The printed circuit board as claimed in claim 1, further comprising a first ferrite bead and a second ferrite bead, the first ferrite bead having two terminals respectively connected to the first via and the second power portion, and the second ferrite bead having two terminals respectively connected to the second via and the second ground portion.

3. The printed circuit board as claimed in claim 1, wherein a first power portion planar area comprising of the extending section of the first power portion in the horizontal direction and a first ground portion planar area comprising of the extending section of the first ground portion in the horizontal direction are unequal, and a second power portion planar area comprising of the extending section of the second power portion in the horizontal direction and a second ground portion planar area comprising of the extending section of the second ground portion in the horizontal direction are unequal.

4. The printed circuit board as claimed in claim 3, wherein the first power portion planar area of the extending section of the first power portion is greater than the first ground portion planar area of the extending section of the first ground portion, and the second power portion planar area of the extending section of the second power portion is greater than the second ground portion planar area of the extending section of the second ground portion.

5. A printed circuit board comprising:
   a first layer comprising a first power portion and a first ground portion arranged edge by edge in a same plane and isolated from each other along adjacent edges thereof; and
   a second layer spaced from the first layer, the second layer comprising a second power portion and a second ground portion arranged edge by edge in a same plane and isolated from each other alone adjacent edges thereof, wherein
   the second ground portion is arranged below the first power portion, the second power portion is arranged below the first ground portion, one part of the first power portion overlaps and is electrically coupled to one part of the second power portion via a first via, and one part of the first ground portion overlaps and is electrically coupled to one part of the second ground portion via a second via to thereby provide a zero-intensity electric field between the first layer and the second layer.

6. The printed circuit board as claimed in claim 5, further comprising a first ferrite bead and a second ferrite bead, the first ferrite bead having two terminals respectively connected to the first via and the second power portion, and the second ferrite bead having two terminals respectively connected to the second via and the second ground portion.

7. The printed circuit board as claimed in claim 5, wherein the adjacent edge of each of the ground portions and the power portions is stepped thereby comprising an extending section in a same plane with the corresponding ground or power portion and a cutout, the extending section of the first power portion extends into the cutout of the first ground portion, the extending section of the first ground portion extends into the cutout of the first power portion, the extending section of the second power portion extends into the cutout of the second ground portion, the extending section of the second ground portion extends into the cutout of the second power portion.

8. The printed circuit board as claimed in claim 7, wherein a planar area of the extending section of the first power portion in the horizontal direction and a planar area of the extending section of the first ground portion are unequal, and a planar area of the extending section of the second power portion and a planar area of the extending section of the second ground portion are unequal.

9. The printed circuit board as claimed in claim 8, wherein the planar area of the extending section of the first power portion is greater than the planar area of the extending section of the first ground portion, and the planar area of the extending section of the second power portion is greater than the planar area of the extending section of the second ground portion.

10. A printed circuit board comprising:
a first layer comprising a first power portion and a first ground portion isolated from each other and arranged in a first plane, the first power portion and the first ground portion having an overlap section; and
a second layer spaced from the first layer, the second layer comprising a second power portion and a second ground portion isolated from each other and arranged in a second plane, the second power portion and the second ground portion having another overlap section, wherein the overlap section overlaps the another overlap section and one part of the first power portion located at the overlap section is electrically coupled to one part of the second power portion located at the another overlap section, and one part of the first ground portion located at the overlap section is electrically coupled to one part of the second ground portion located at the another overlap section to thereby form a zero-intensity electric field between the first layer and the second layer.

11. The printed circuit board as claimed in claim 10, wherein a first via extends through the one part of the first power portion located at the overlap section and the one part of the second power portion located at the another overlap section, and a second via extends through the one part of the first ground portion located at the overlap and the one part of the second ground portion located at the another overlap section.

12. The printed circuit board as claimed in claim 11, further comprising a first ferrite bead and a second ferrite bead, the first ferrite bead having two terminals respectively connected to the first via and one of the first power portion and the second power portion, and the second ferrite bead having two terminals respectively connected to the second via and one of the first ground portion and the second ground portion.

13. The printed circuit board as claimed in claim 10, wherein an area of the one part of the first power portion located at the overlap section is equal to that of the one part of the second power portion located at the another overlap section.

14. The printed circuit board as claimed in claim 13, wherein an area of the one part of the first ground portion located at the overlap section is equal to that of the one part of the second ground portion located at the another overlap section.

15. The printed circuit board as claimed in claim 13, wherein the area of the one part of the first power portion located at the overlap section is unequal to that of the one part of the first ground portion located at the overlap section.

* * * * *